United States Patent [19]

Falabella et al.

[11] Patent Number: 5,279,723
[45] Date of Patent: Jan. 18, 1994

[54] FILTERED CATHODIC ARC SOURCE

[75] Inventors: Steven Falabella; David M. Sanders, both of Livermore, Calif.

[73] Assignee: as represented by the United States Department of Energy, Washington, D.C.

[21] Appl. No.: 921,780

[22] Filed: Jul. 30, 1992

[51] Int. Cl.[5] .................................................. C23C 14/32
[52] U.S. Cl. ........................... 204/192.38; 204/298.41; 250/426; 313/153; 313/157; 427/580
[58] Field of Search .................. 204/192.38, 298.41; 427/580; 313/153, 157; 250/426

[56] References Cited

U.S. PATENT DOCUMENTS

| | | | |
|---|---|---|---|
| 2,724,058 | 11/1955 | Frankel | 250/298 |
| 2,777,958 | 1/1957 | LePoole | 250/397 |
| 2,906,879 | 9/1959 | Glaser | 250/396 ML |
| 2,972,695 | 2/1961 | Wroe | 313/157 |
| 3,376,414 | 4/1968 | Bell, Jr. et al. | 250/289 |
| 3,625,848 | 12/1971 | Snaper | 204/192.38 |
| 4,180,450 | 12/1979 | Morrison, Jr. | 204/298.19 |
| 4,204,936 | 5/1980 | Hartsough | 204/192.12 |
| 4,221,652 | 9/1980 | Kuriyama | 204/298.22 |
| 4,452,686 | 6/1984 | Axenov et al. | 204/298.41 |
| 4,544,468 | 10/1985 | Munz et al. | 204/192.12 |
| 4,587,432 | 5/1986 | Aitken | 250/592.2 |
| 4,634,931 | 1/1987 | Taya et al. | 315/111.81 |
| 4,649,278 | 3/1987 | Chutjian et al. | 250/423 R |
| 4,766,320 | 8/1988 | Naitoh et al. | 250/492.2 |
| 4,824,544 | 4/1989 | Mikalesen et al. | 204/298.06 |
| 4,855,033 | 8/1989 | Hurwitt | 204/298.09 |
| 4,892,633 | 1/1990 | Welty | 204/192.12 |
| 5,078,848 | 1/1992 | Anttila et al. | 204/192.38 |
| 5,126,030 | 6/1992 | Tamagaki et al. | 204/192.38 |

FOREIGN PATENT DOCUMENTS

| | | |
|---|---|---|
| 0381912 | 8/1990 | European Pat. Off. . |
| 1-204370 | 9/1986 | Japan .................................. 427/523 |
| 2-125868 | 5/1990 | Japan . |

OTHER PUBLICATIONS

I. I. Aksenov et al., Transport of Plasma Streams in a Curvilinear Plasma-Optics System, *Sov. J. Plasma Phys.* 4(4), Jul.-Aug. 1978, 425-428.

D. M. Sanders, Review of Ion-Based Coating Processes Derived from the Cathodic Arc, *J. Vac. Sci. Technol.* A7 (3), Mar.-Jun. 1989, 2339-2345.

D. M. Sanders et al., Coating Technology Based on the Vacuum Arc-A Review, *IEEE Trans. On Plasma Science*, vol. 18, No. 6, Dec. 1990, 883-894.

D. M. Sanders et al., Coatings from Ions-Modeling and Experiments, UCRL-53868-90, Manuscript Date: Aug. 1991, 4-14 to 4-18.

S. Falabella et al., Comparison of Two Filtered Cathodic Arc Sources, *J. Vac. Sci., Technol.* A (10(2), Mar./Apr. 1992, 394-397.

*Primary Examiner*—Aaron Weisstuch
*Attorney, Agent, or Firm*—Henry P. Sartorio; Roger S. Gaither; William R. Moser

[57] ABSTRACT

A continuous, cathodic arc ion source coupled to a macro-particle filter capable of separation or elimination of macro-particles from the ion flux produced by cathodic arc discharge. The ion source employs an axial magnetic field on a cathode (target) having tapered sides to confine the arc, thereby providing high target material utilization. A bent magnetic field is used to guide the metal ions from the target to the part to be coated. The macro-particle filter consists of two straight solenoids, end to end, but placed at 45° to one another, which prevents line-of-sight from the arc spot on the target to the parts to be coated, yet provides a path for ions and electrons to flow, and includes a series of baffles for trapping the macro-particles.

20 Claims, 2 Drawing Sheets

FILTERED CATHODIC ARC SOURCE

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention is directed to an ion source, particular to an ion source using a cathodic vacuum arc, and more particularly to an ion source using a filtered cathodic arc for the production of dense, adherent coatings, wherein the filtering eliminates or reduces macro-particles normally produced by the cathodic arc.

Coatings produced by traditional physical vapor deposition (PVD) techniques, such as electron-beam evaporation and magnetron sputtering are adequate for many purposes. However, these are increasingly frequent instances where coatings produced by a PVD technique have inadequate stoichiometry, adhesion, or density.

Ion-based coating methods have the potential to produce superior coatings due to the ability to control the arrival energy of the ions. Ion sources involving vacuum arc-based processes offer the prospect for overcoming the difficulties relative to the PVD techniques by making use of their ability to provide copious quantities of ions of virtually any conductive material. Vacuum arc coating techniques generally involve use of either an anodic arc or a cathodic arc, with the cathode arc technique being of either a pulsed or continuous type.

Cathodic vacuum arc systems for coating applications are relatively new, although it has been recognized for decades that coatings could be produced using a vacuum arc. The historical background and development of vacuum arcs is set forth in an article entitled "Review of Ion-Based Coating Processes Derived from the Cathodic Arc" by David M. Sanders, *J. Vac. Sci. Technol.*, A7 (3), May/June 1989, pp. 2339-2345, and in an article entitled "Coating Technology Based on the Vacuum Arc-A Review" by D. M. Sanders et al., *IEEE Trans. Plasma Sci.* 18 (6), pp. 883-894, 1990.

While it has been recognized for some time that cathodic arcs can provide a copious source of ions for the production of coatings in a vacuum system, it has also been recognized that such arcs normally produce droplets of material called macro-particles which lead to blemishes in the coatings thus produced. The separation or elimination of macro-particles from the ion flux produced by a cathodic arc discharge has long been the goal of many research efforts. A number of approaches have been advanced for the removal of such macro-particles, which include the use of filtering and such are exemplified in the above-referenced articles. Also, see an article entitled "Transport of Plasma Streams in a Curvilinear Plasma-Optics System", *Sov. J. Plasma Phys.*, 4 (4), pp. 425-428 July-August, 1978, I. I. Aksenov et al. However, these prior approaches have not resulted in providing both an effective ion source and a means for eliminating or reducing the macro-particles produced by the cathodic arc techniques.

Therefore, there has existed a need for an ion source based on the cathodic arc discharge which is capable of producing coatings without blemishes caused by macro-particles. The present invention fulfills the prior need by providing an ion source using the cathodic vacuum arc for producing large currents of positive ions of a wide variety of materials, wherein the ions produce coatings with improved properties such as high density and adhesion, while the coatings are essentially free of blemishes caused by macro-particles, the macro-particles having been filtered out.

SUMMARY OF THE INVENTION

An object of the present invention is to provide an ion source using a cathodic vacuum arc.

A further object of the invention is to provide a cathodic vacuum arc for producing a highly ionized metal vapor for dense, adherent coatings.

A further object of the invention is to provide a filtered cathodic arc ion source using a bent magnetic field for eliminating macro-particles.

A still further object of the invention is to provide an ion source using a cathodic vacuum arc and means for filtering out macro-particles produced by the cathodic arc.

Another object of the invention is to provide a cathodic arc ion source which confines the arc to the end of a frustum-shaped cathode (target) which increases utilization of the target material.

Another object of the invention is to provide a cathodic arc ion source coupled to a macro-particle filter.

Another object of the invention is to provide a macro-particle filter for a cathodic arc ion source which uses a bent magnetic field and which consists of a plurality of straight solenoids, end to end, but placed at 45° to one another.

Another object of the invention is to provide a filtered cathodic arc ion source which uses a cathode (target) having tapered sides and a forty-five degree macro-particle filter, which utilizes a series of baffles for trapping macro-particles.

Other objects and advantages of the present invention will become apparent from the following description and accompanying drawings.

Basically, the present invention comprises a cathodic arc ion source coupled to a macro-particle filter using a bent magnetic field to guide the ions from the target to a point of use. The ion source utilizes a frustum-shaped cathode (target) which confines the arc to the end of the target, whereby the arc spot moves randomly and provides for good utilization of the target material. The macro-particle filter consists of two straight solenoids placed end-to-end, but at 45° to one another. This prevents line-of-sight from the arc spot on the target to the parts to be coated, yet provides a path for ions and electrons to flow. The filter also includes a plurality of baffles attached to the inner wall to trap the macro-particles and prevent the macro-particles from bouncing off the walls of the vacuum chamber and reaching the parts to be coated.

BRIEF DESCRIPTION OF THE DRAWINGS

The drawings, when taken in conjunction with the description of the invention, will set forth the principals upon which the present invention is based.

DETAILED DESCRIPTION OF THE INVENTION

Figure 1:
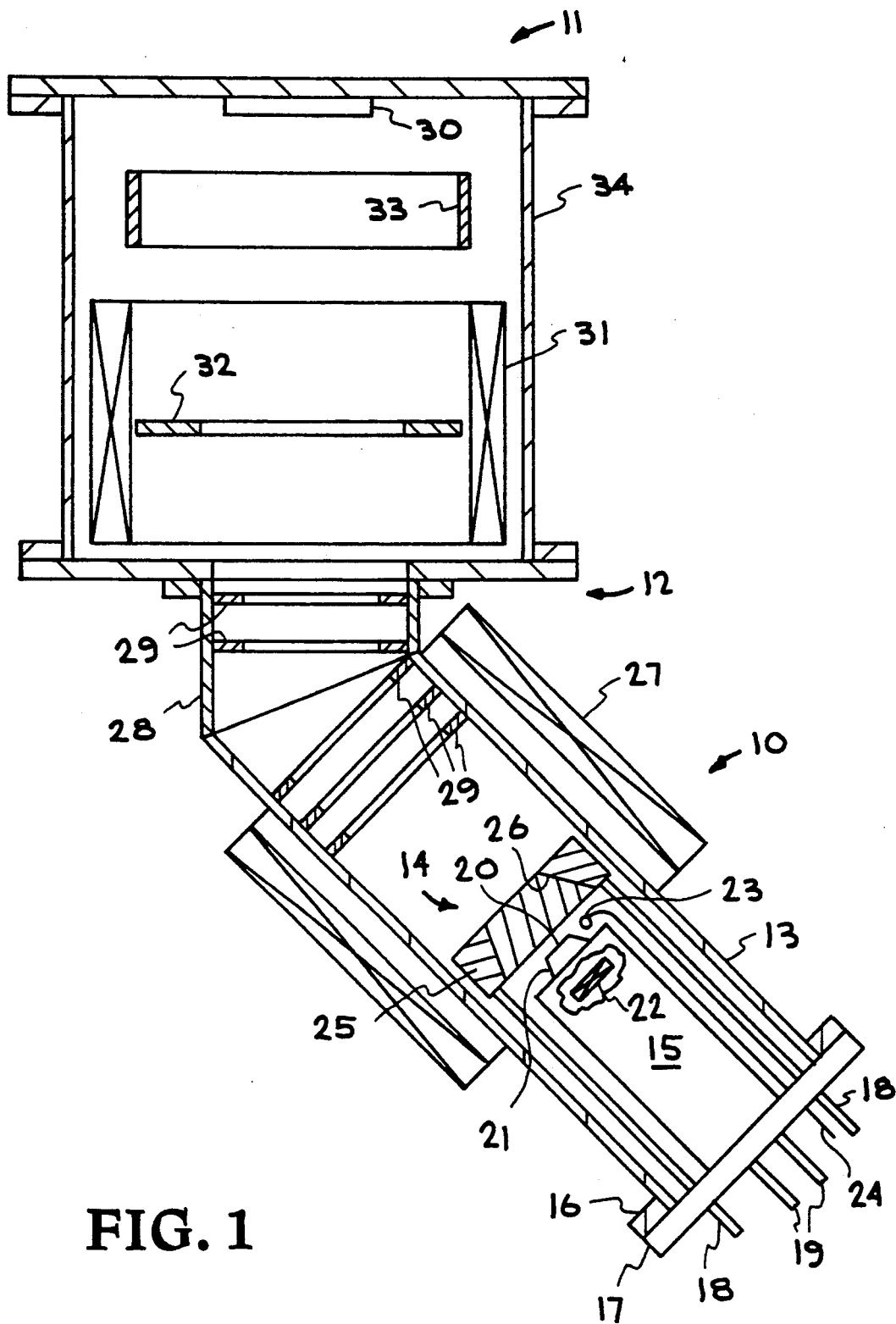
FIG. 1 is a schematic illustration of an embodiment of the filtered ion source made in accordance with the present invention.

The present invention is directed to a filtered cathodic arc ion source which is particularly applicable for coating small parts, and utilizes a bent magnetic field to guide the metal ions from the target to the part to be coated, while preventing macro-particles from hitting the part to be coated. The bent magnetic field is produced by two solenoids, placed end-to-end, but bent at a 45 degree angle. The two straight sections replace the prior known 90 degree angle toroidal system; and tests have shown the straight solenoids with a 45° bend have higher transmission than curved sections. To prevent macro-particles from bouncing off the walls of the chamber and thus reaching the part to be coated, a plurality of baffles are used to trap the macro-particles; and tests have shown that the baffles reduce the number of macro-particles reaching the part to be coated to near zero.

The filtered ion source consists basically of a cathodic arc source coupled to a macro-particle filter. The arc source itself is constructed mainly of off-the-shelf vacuum components, and utilizes an axial magnetic field and a standard 15 cc E-beam evaporation charge brazed to a water-cooled target holder. The target or cathode is of a frustum-shape and due to the tapered sides of the target, the arc is confined to the end thereof for increased target material utilization. The arc tends to drift in the direction of the acute angle (15°) formed between the target surface and the magnetic field. This pushes the arc to the end of the target. On the end of the target, the arc spot moves randomly, eroding the target surface in such a way that it forms a surface normal to the magnetic field lines. The arc moves preferentially to the high spots on the target surface, ensuring even target erosion and good utilization of target material. Target material utilization of over 65% has been demonstrated by this source. In addition, target materials with inherently low spot mobility, such as a 15 cc graphite target, have been run in the present source for over an hour at 100 amps.

The filtered ion source of the present invention also utilizes placement of a secondary or auxiliary anode near the part to be coated (substrate), and is adapted for introducing reactive gases near the substrate, which allows the source to run reliably during reactive depositions. The metal coating rate on the primary anode, located close to the arc target (cathode), is sufficiently high to avoid problems with insulating layers forming and interfering with the flow of arc current. Ions are electrostatically repelled from the secondary or auxiliary anode located at the exit of the filter, so its coating rate is low and requires only periodic cleaning.

The flow of electrons through the macro-particle filter to the secondary anode generates the potentials and produces the electrostatic field required to guide the ions around the 45° bend in the filter. The magnetic field strengths in the two straight solenoids are variable and not strong enough to influence the ion trajectories directly, but a 50–200 G field constrains the electrons strongly. Limiting cross-field motion of the electrons allows an electrostatic potential to build in the system, which in turn, guides the ions. Any cross-field conducting surfaces will reduce the potentials produced, and reduce the ion transport efficiency through the filter.

The magnetic field lines of the present source are nearly parallel to the walls of the vacuum chamber, and the field lines terminate at the annular anodes located at both ends of the filter, with an electrically floating ring surrounding the cathode (arc target). The magnetic field is substantially continuous from the cathode through the filter, which has been shown to give up to 80% ion transmission in straight, solenoidal systems. The source of this invention takes advantage of this by using two straight sections bent at 45° rather than the previously known 90° toroidal section. While the source of this invention has not been optimized, it delivers over 3 A of ions at the end of the filter out of 10 A produced at the arc and a peak coating rate over 0.8 $\mu$m/min. of titanium nitride for an arc current of 100 A.

To protect the part to be coated (substrate) from macro-particles, baffles made of non-magnetic material are positioned in the location that would lead to a single-bounce path from target to substrate. The baffles are positioned so bounce trajectories would hit the chamber walls, or preferably head back toward the target. The effectiveness of the baffles has been clearly shown by tests where the macro-particle density dropped a hundredfold with addition of baffles in the bent-tube section of the source. Tests showed that the remaining macro-particles typically number less than 0.2 particle/cm$^2$/min. of coating time for most materials at 100 A of arc current, and optimizing of the baffling should eliminate any remaining areas that have a single-bounce path to the substrate.

The ion source of this invention has been shown to operate reliably for many tens of minutes at a time, and can use target materials efficiently, even difficult materials such as graphite. It has been shown that ion transport through the filter is improved by adding an anode at the exit of the macro-particle filter and carrying a portion of the arc current through the filter. This current also ionizes any background gas in the chamber, and may improve reactive coatings.

The ions exiting the macro-particle filter in the embodiment tested are concentrated in a beam of about 2 inches in diameter, using a source having an inside wall diameter of 6 inches, with the baffles reducing the source diameter to 4.5 inches, and thus are effective for coating small parts. To coat larger parts, it has been shown experimentally that the ion beam can be rastered easily with externally applied magnetic fields on the order of 10 G, which fields are not strong enough to modify the ion trajectories directly. This is a further confirmation of the flux-tube model upon which the macro-particle filter is based.

Referring now to the drawings, FIG. 1 schematically illustrates an embodiment of the invention utilizing a bent magnetic field which takes the advantages provided by utilizing straight solenoidal sections. A cathodic arc ion source generally indicated at 10 is connected to a vacuum chamber generally indicated at 11 via a hollow interconnect or coupling assembly 12. The ion source 10 comprises a housing 13 forming a chamber therein and within which is positioned a water-cooled anode assembly 14 and a water-cooled cathode (target material) assembly generally indicated at 15. The assemblies 14 and 15 are retained in housing 13 via a flange 16 and end plate 17. Extending through end plate 17 are coolant lines 18 for the anode assembly 14 and coolant lines 19 for the cathode or target assembly 15. The cathode assembly 15 contains a cathode 20 which may be of a standard type, known as an E-beam muffin, which may be composed of copper, titanium, graphite, or other conductive metal, and having tapered or sloped sides 21, and a magnet 22 positioned behind (below) cathode 20. An arc starter 23 is positioned in spaced relation to cathode 20. If desired, magnet 22 may be omitted for certain applications. In addition to the coolant lines for anode assembly 14 and cathode assembly 15, which pass through end plate 17, electrical power supply leads or lines, not shown, connect assemblies 14 and 15 with appropriate external power sources and a control mechanism, not shown. Also, a lead 24 passes through end plate 17 and interconnects arc starter 23 with appropriate power supply and/or control means, not shown. Appropriate seals are provided around the components which extend through plate 17. Anode assembly 14 includes an annular hollow anode 25 having tapering or sloping sides 26. A solenoidal coil 27 extends around the exterior of housing 13 and is connected to a power supply, not shown.

Housing 13 of ion source 10 is connected to a housing extension 28 connected at a 45° angle, with housing extension 28 being connected to vacuum chamber 11 via coupling assembly 12. Positioned within housing 13 and extension 28 are a plurality of spaced baffles 29, which consist of annular rings made of non-magnetic material, such as stainless steel sheeting. The number, spacing, and location of the baffles 29 depend on the single-bounce pattern of macro-particles from the arc target or cathode 20, so as to prevent macro-particles from reaching parts to be coated, indicated at 30 located at the exit end of vacuum chamber 11 as shown.

Vacuum chamber 11 is provided with means for drawing a vacuum, not shown, but known in the art, and provided with an internally located cylindrical coil 31, an annular baffle 32, and an auxiliary or secondary anode 33, each operatively connected to and/or supported by a wall 34 of vacuum chamber 11. Coil 31 and auxiliary anode 33 are connected to appropriate electrical power supplies, not shown. Baffle 32 is constructed of non-magnetic material as are baffles 29. While the coil 31 is illustrated as being mounted within wall 34 of vacuum chamber 11, such is due to the geometry of the existing vacuum chamber. It is not a requirement that coil 31 be inside wall 34, only that it produces a solenoidal B-field. In fact, construction may be simpler if the coil is mounted externally of wall 34.

As shown in FIG. 1, the magnetic field produced by coil 27 around anode and cathode assemblies 14 and 15, and the 15° slope on the side 21 of cathode 20 confines the arc spot to the end of the cathode 20. The spot moves randomly over the end surface, and uniformly erodes the cathode 20. The arc spot preferentially moves to the high spots on the target or cathode, eroding them back to level (defined as a surface normal to the magnetic field lines at the cathode). This leads to nearly complete utilization of the material of target or cathode 20.

As seen in FIG. 1, the macro-particle filter consists of two straight solenoids (coils 27 and 31) placed end-to-end, but positioned at 45° to each other. This prevents line-of-sight from the arc spot on target 20 to the parts to be coated, indicated at 30, yet provides a path for ions and electrons to flow. The flows of electrons through the filter to the auxiliary anode 33, placed at the end of the filter, generate the potentials required to guide the ions around the bend formed by housing 13 and housing extension 20 of ion source 10. The filter includes the baffles 29 and baffle 32 which function to prevent macro-particles particles produced in target 20 from bouncing off the walls 13 and 34 and reaching the part 32 to be coated. These baffles are positioned so the first bounce reflects the particle back toward the target 20, or traps the particle, thereby preventing same from passing with the ions to parts 30 to be coated.

As pointed out above, the magnetic field lines are nearly parallel to the walls 13 and 34 of the ion source 10 and vacuum chamber 11, and terminate at annular anodes 25 and 33 at both ends of the filter, with anode 25 surrounding the cathode or target 20. The magnetic field is substantially continuous from the cathode 20 through the coil 31 and anode 32 by using two straight sections 27 and 31 bent at 45°, which has been shown to give up to 80% ion transmission in straight, solenoidal systems, and tests have shown the bent-magnetic field arrangement of FIG. 1 delivers over 3 A of ions and a peak coating rate of over 0.8 $\mu$m/min. of titanium nitride for an arc current of 100 A.

Figure 2:
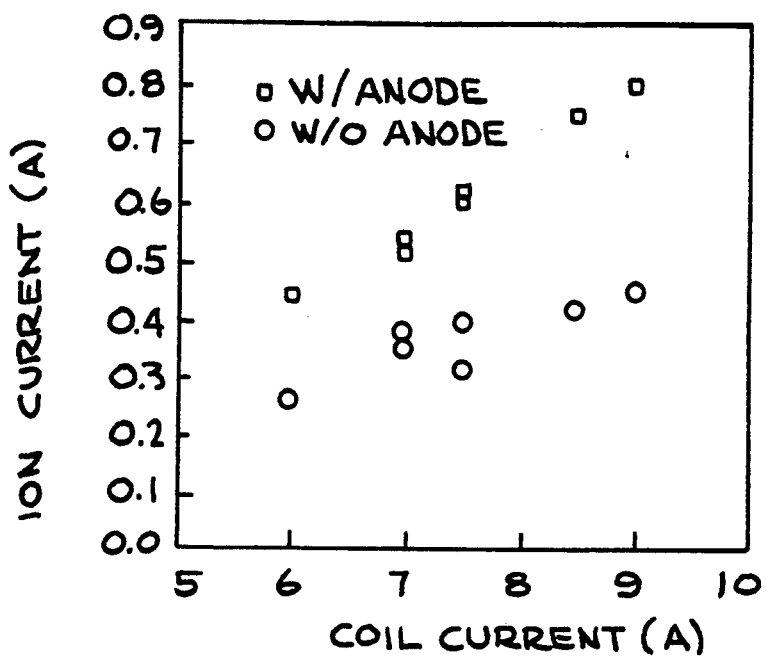
FIG. 2 is a diagram illustrating ion current increase relative to increasing magnetic field produced by increased current in the coils.
Figure 3:
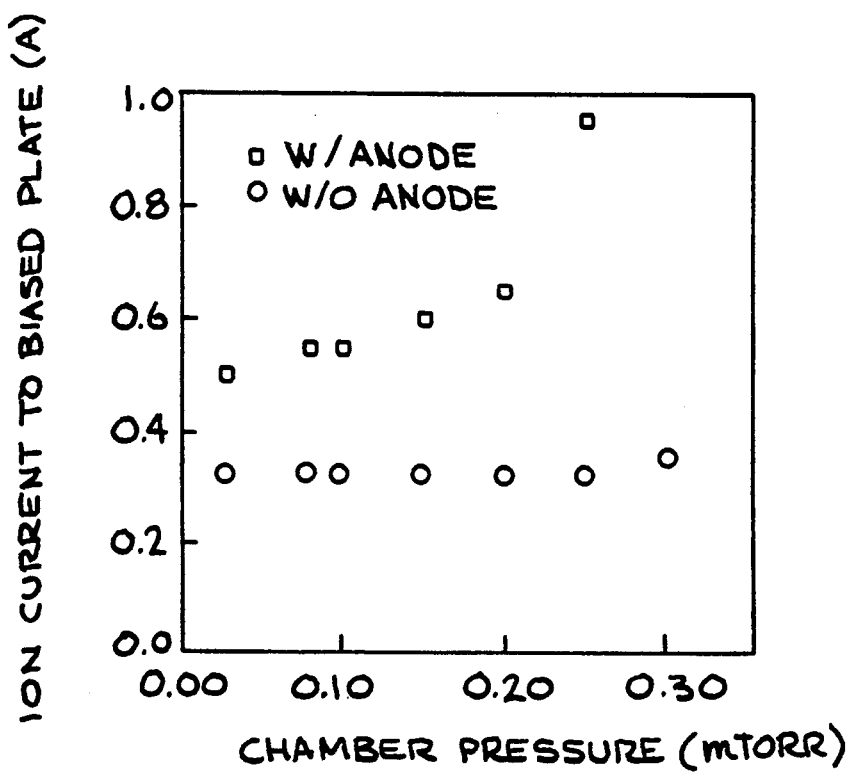
FIG. 3 is a diagram illustrating measured current with increasing chamber pressure.

To determine how the electron current flowing through the source effects the ion transmission efficiency, the apparatus of FIG. 1 was operated with and without the secondary or auxiliary anode 33, located at the exit of the filter and connected to the arc-power supply. The current in the field coils 27 and 31 was varied, and the current to a biased plate was measured, with and without the anode 33 connected. As seen in FIG. 2, the first plot shows the increase in measured current when the anode was connected. The measured current increased by nearly 80% for the higher magnetic field cases (coil current increased). For such tests, the pressure of vacuum chamber 11 was held at 0.15 mTorr of argon to stabilize the arc. To determine if the measured current was affected by the argon, the ion current was measured as the chamber pressure was varied, both with and without the anode 33 connected. This is shown in FIG. 3. The increase in current at the higher pressure in the cases with the anode 33 connected is thought to be due to argon ionized by the electrons flowing to the anode 33. The cases with the anode disconnected show no increase in current as the pressure is increased. For the ion currents shown in FIG. 2, those measured with the anode connected are expected to include approximately 20% argon ions. The ionization of the background gas may aid the formation of reactive coatings such as titanium nitride. However, if the pressure in chamber 11 is raised above 0.5 mTorr, it has been observed that the transmission of metal ions through the filter is substantially reduced, apparently by collisional cross-field diffusion of electrons reducing the depth of the potential well that guides the ions through the filter. The following example illustrates a practical application of the invention illustrated in FIG. 1 for coating a substrate with titanium with a nitrogen background gas, thus producing a titanium nitride (TiN) coating on the substrate.

EXAMPLE

The substrate is first cleaned in situ with a DC sputter etch in argon. The coil currents in the source and chamber coils were 9.3 and 30 amperes, respectively. The nitrogen flow rate was 165 sccm, with the iris valve set to 15%, giving a chamber pressure of 0.30 mTorr during the coating run and 2.88 mTorr after the run. The pressure was low during the run due to the gettering effect of the fresh titanium coating on the chamber walls. No argon was introduced into the chamber during the coating run. The substrate was biased during the coating to 200 v. The arc current was 100 amperes, with an arc voltage of 42–43 volts. The coating rate under these conditions was 2.5–8 k Å per minute.

It has thus been shown that the present invention provides a solution to the problem of producing blemished coatings from ion sources using a cathodic arc discharge by means of its macro-particle-filtered cathodic arc ion source for use in high-rate coating of metals and reactively produced oxide and nitrides. The invention has illustrated the flux-tube model of plasma transport and has verified that baffles can be used to protect substrates or parts to be coated from macro-particles bouncing off the vacuum chamber or ion source walls. The invention provides improved ion transmission through the macro-particle filter by utilizing an anode at the exit of the filter, and carrying a portion of the arc current through the filter, which current also ionizes any background gas in the chamber.

While a specific embodiment for describing the principles and operation of the invention has been illustrated and described utilizing specified materials, parameters, examples, etc., such is not intended to limit the invention to the specifics illustrated and/or described. Modifications and changes will become apparent to those skilled in this art without departing from the scope of the present invention. Therefore, it is intended that the scope of this invention only be limited by the appended claims.

We claim:

1. A filtered cathodic arc ion source, comprising:
   a first housing;
   a second housing;
   said first housing being connected to said second housing at about a 45° angle;
   a cathode assembly mounted in said first housing;
   a first anode mounted in said first housing;
   a second anode mounted in said second housing;
   a first magnetic coil positioned around at least a section of said first housing;
   a second magnetic coil mounted with respect to said second housing and located intermediate said first coil and said second anode; and
   baffle means mounted in at least said first housing;
   whereby ions produced by said cathode assembly are directed through said first and second housings to a point of use, and macro-particles produced by said cathode are trapped by said baffles and prevented from passing through said first and second housings.

2. The ion source of claim 1, wherein said cathode assembly includes a cathode having tapered outer side surfaces, such that a magnetic field produced by said first coil in conjunction with the taper on the sides of the cathode confines an arc spot to an end surface of the cathode and which moves randomly over the end surface for uniformly eroding the cathode.

3. The ion source of claim 1, wherein said first and second coils are constructed and mounted in a bent end-to-end relation so as to produce a continuous bent magnetic field from said first anode to said second anode, which functions to guide ions around the bent section located between said coils.

4. The ion source of claim 1 wherein said first and second anodes are each of an annular configuration.

5. The ion source of claim 1, wherein said baffle means includes a plurality of annular baffles secured to a wall section of said first housing and located so as to reflect macro-particles back toward said cathode and trap such macro-particles.

6. The ion source of claim 5, wherein said baffle means additionally includes at least one annular non-magnetic baffle located in said second housing intermediate said first anode and said second anode.

7. The ion source of claim 1, wherein said first housing includes a first section and a second interconnected at about a 45° angle, said second section of said first housing being connected to said second housing.

8. The ion source of claim 7, wherein said baffle means includes a plurality of annular non-magnetic baffles secured to walls of said first and second sections of said first housing and located adjacent to the 45° angle interconnection.

9. The ion source of claim 1, additionally including an arc starter located adjacent said cathode assembly.

10. The ion source of claim 1, additional including means for cooling said cathode assembly and at least said first anode.

11. The ion source of claim 1, wherein said first anode comprises a hollow member having a tapered interior surface, and wherein said cathode assembly includes a cathode having a tapered outer surface.

12. In a cathodic arc ion source having a cathode, an anode, and a pair of magnetic coils operatively mounted to a housing, the improvement comprising:
   said pair of coils being mounted in an end-to-end relation, but positioned at a 45° angle to each other; and
   including an auxiliary annular anode positioned adjacent an end of one of said pair of coils.

13. The improvement of claim 12, wherein said first-mentioned anode is annular and mounted adjacent an opposite end of said pair of coils.

14. The improvement of claim 13, wherein said housing includes a first section and a second section, said first section having a first portion extending at a 45° angle with respect to the second portion thereof, said second portion of said first housing section being connected to said second housing section.

15. The improvement of claim 14, wherein one of said pair of coils is mounted around at least part of said first housing section, wherein another of said pair of coils is mounted within said second housing section, and wherein said auxiliary annular anode is mounted in said second housing section.

16. The improvement of claim 15, additionally including a plurality of annular non-magnetic baffles mounted in said housing, at least a portion of said baffles being mounted in said first and section portions of said first housing section.

17. The improvement of claim 16, wherein at least one of said annular baffles is mounted in said second housing section at a location intermediate said baffles in said first housing section and said auxiliary anode.

18. The improvement of claim 17, wherein said cathode has tapered outer side surfaces, and a magnet is positioned adjacent to a back surface of said cathode.

19. A method for substantially removing macro-particles produced in a cathodic arc ion source, comprising the steps of:
   forming a housing having a 45° bend therein;
   positioning a cathode and a first annular anode in one end of the housing;
   positioning a second annular anode in an opposite end of said housing;

providing a pair of solenoids in an end-to-end relationship, but bent at 45° with respect to one another;

positioning the pair of solenoids so that each of the pair are on opposite sides of the 45° bend in the housing;

providing a plurality of non-magnetic annular baffles in the housing so as to be located on both sides of the 45° bend in the housing, and supplying appropriate electrical power to the cathode, the anodes, and the solenoids;

whereby ions produced by the cathode are guided by a magnetic field, extending from the first anode to the second anode, from the cathode through the 45° bend in the housing to a point of use located beyond the second anode, and whereby macro-particles produced by the cathode are reflected and trapped by the annular baffles preventing the macro-particles from passing through the entirety of the housing.

20. The method of claim 19, additionally including the step of forming the cathode with tapering side surfaces, whereby the magnetic field produced by the solenoid located adjacent to the cathode in conjunction with the taper of the cathode side surfaces confines an arc spot on the cathode to the end of the cathode resulting in uniform eroding of the cathode by the arc spot.

* * * * *